(12) United States Patent
Inoue

(10) Patent No.: US 8,884,653 B2
(45) Date of Patent: Nov. 11, 2014

(54) COMPARATOR AND AD CONVERTER PROVIDED THEREWITH

(75) Inventor: Fumihiro Inoue, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 13/811,955

(22) PCT Filed: Jul. 22, 2011

(86) PCT No.: PCT/JP2011/066749
§ 371 (c)(1),
(2), (4) Date: Jan. 24, 2013

(87) PCT Pub. No.: WO2012/035882
PCT Pub. Date: Mar. 22, 2012

(65) Prior Publication Data
US 2013/0120025 A1    May 16, 2013

(30) Foreign Application Priority Data
Sep. 15, 2010    (JP) .................................. 2010-207226

(51) Int. Cl.
*H03K 5/24*    (2006.01)

(52) U.S. Cl.
CPC ................. *H03K 5/24* (2013.01); *H03K 5/2481* (2013.01); *H03K 5/249* (2013.01)
USPC .................................. 327/55; 327/54; 327/67

(58) Field of Classification Search
CPC ........ H03K 5/24; H03K 5/249; H03K 5/2481
USPC ............ 327/67, 52, 54, 55, 56, 65, 77, 82, 85, 327/87, 89, 561, 563
See application file for complete search history.

(56) References Cited

U.S. PATENT DOCUMENTS

| 5,272,395 A | 12/1993 | Vincelette |
| 6,404,229 B1 * | 6/2002 | Barnes ............................ 326/68 |
| 6,967,504 B2 * | 11/2005 | Aoki ................................ 327/52 |

FOREIGN PATENT DOCUMENTS

| JP | 4-195891 | 7/1992 |
| JP | H06-500680 | 1/1994 |
| JP | 7-074600 | 3/1995 |
| JP | 2007-318457 | 12/2007 |

OTHER PUBLICATIONS

International Search Report mailed on Aug. 16, 2011.
Japanese Office Action mailed Jul. 29, 2014.

* cited by examiner

*Primary Examiner* — Jung H Kim
(74) *Attorney, Agent, or Firm* — IPUSA, PLLC

(57) ABSTRACT

Disclosed is a comparator including a switching element, a differential pair, and a positive feedback part, the positive feedback part including a first CMOS inverter and a second CMOS inverter, the first CMOS inverter including a first element for providing a potential difference between a first PMOS transistor and a first NMOS transistor, the second CMOS inverter including a second element for providing a potential difference between a second PMOS transistor and a second NMOS transistor, a higher potential side of the first element being connected to a gate of the second NMOS transistor, a lower potential side of the first element being connected to a gate of the second PMOS transistor, a higher potential side of the second element being connected to a gate of the first NMOS transistor, and a lower potential side of the second element being connected to a gate of the first PMOS transistor.

7 Claims, 5 Drawing Sheets

COMPARATOR AND AD CONVERTER PROVIDED THEREWITH

TECHNICAL FIELD

The present invention relates to a comparator having a switch which turns on/off in synchronization with a clock signal, a differential pair which conducts an operation of comparison in synchronization with turning on/off of the switch, a positive feedback part which outputs a result of comparison by the differential pair, and an AD converter provided therewith.

BACKGROUND ART

FIG. 1 is a configuration diagram of a conventional dynamic comparator 1. The dynamic comparator 1 has two CMOS inverters IV1 and IV2 subject to positive feedback, a differential pair D1 for conducting determination of a magnitude relation between input voltages IN+ and IN−, and a switch M0 for switching on/off of the dynamic comparator 1 depending on a clock signal CLK. The first CMOS inverter IV1 is composed of a PMOS transistor M3 and an NMOS transistor M4 and the second CMOS inverter IV2 is composed of a PMOS transistor M5 and an NMOS transistor M6. The differential pair D1 is composed of an NMOS transistor M1 and an NMOS transistor M2. As the dynamic comparator 1 is turned on by the switch M0, a differential electric current is generated depending on the difference between input voltages IN+ and IN− supplied to the differential pair D1 to cause a difference between the capabilities of the first CMOS inverter IV1 and second CMOS inverter IV2 which are connected as load, whereby it is possible to determine a magnitude relation between input voltages IN+ and IN−.

Additionally, for example, patent document 1 is known as a prior art document for a dynamic comparator.
Patent document 1: Japanese Patent Publication No. 2007-318457

SUMMARY OF THE INVENTION

Problems to be Solved by the Invention

However, as an operation is conducted at an electric power supply voltage Vdd which is a low voltage such as a case of Vdd<Vth_p+Vth_n, wherein Vdd is such an electric power supply voltage, Vth_p is threshold voltages of the PMOS transistors M3 and M5, and Vth_n is threshold voltages of the NMOS transistors M4 and M6, no capability of passing sufficient electric currents through the CMOS inverters IV1 and IV2 is generated, so that outputs are not switched even though positive feedback is applied, and it is not possible to conduct determination of a magnitude relation normally.

For example, FIG. 2 illustrates a condition where an input and an output of the CMOS inverter are balanced. Veff_p denotes an overdrive voltage of the PMOS transistor M3 and Veff_n denotes an overdrive voltage of the NMOS transistor M4. When the electric power supply voltage Vdd is high, the PMOS transistor M3 is turned on by applying a driving voltage (Vth_p+Veff_p) between the gate and the source of the PMOS transistor M3, and the NMOS transistor M4 is turned on by applying a driving voltage (Vth_n+Veff_n) between the gate and the source of the NMOS transistor M4. However, if the electric power supply voltage Vdd is too low, a driving voltage capable of turning on the transistors M3 and M4 is insufficient so that it is not possible to pass a drain current Id through the transistors M3 and M4 and thereby it is not possible to make a positive feedback function correctly.

That is, when the condition of the electric power supply voltage Vdd is a low voltage condition on which it is not possible to ensure an overdrive voltage Veff sufficiently, output voltages OUT+ and OUT− of the two CMOS inverters subject to positive feedback are not readily stabilized even if the clock signal CLK is at a high level, as illustrated in FIG. 3, so that it is not possible to conduct determination of a magnitude relation between the input voltages IN+ and IN− within a desired time period (a time period for determination of a magnitude relation between the input voltages IN+ and IN− is prolonged).

Hence, the present invention aims at provision of a comparator capable of operating normally even on a low electric power supply voltage condition such as a case of Vdd<Vth_p+Vth_n, and an AD converter provided therewith.

Means for Solving the Problem

In order to achieve the object, a comparator according to the present invention is a comparator having a switch which turns on/off in synchronization with a clock signal, a differential pair which conducts an operation of comparison in synchronization with turning on/off of the switch, and a positive feedback part which outputs a result of comparison by the differential pair, characterized in that the positive feedback part is provided with a first resistor inserted between a first PMOS transistor and a first NMOS transistor and a second resistor inserted between a second PMOS transistor and a second NMOS transistor, wherein a gate of the second PMOS transistor is connected to a lower electric potential side of the first resistor, a gate of the second NMOS transistor is connected to a higher electric potential side of the first resistor, wherein a gate of the first PMOS transistor is connected to a lower electric potential side of the second resistor, and wherein a gate of the first NMOS transistor is connected to a higher electric potential side of the second electrode.

Furthermore, in order to achieve the object, an AD converter according to the present invention is provided with a comparator according to the present invention.

Advantageous Effect of the Invention

According to the present invention, it is possible to operate normally even on a low electric supply voltage condition such as a case of Vdd<Vth_p+Vth_n.

MODE FOR CARRYING OUT THE INVENTION

A description of a mode for carrying out the present invention will be provided with reference to the drawings below. Additionally, in each drawing, a transistor for which a circle is attached to a gate thereof indicates a P-channel type MOS transistor and a transistor for which no circle is attached to a gate thereof indicates an N-channel type MOS transistor.

Figure 4:
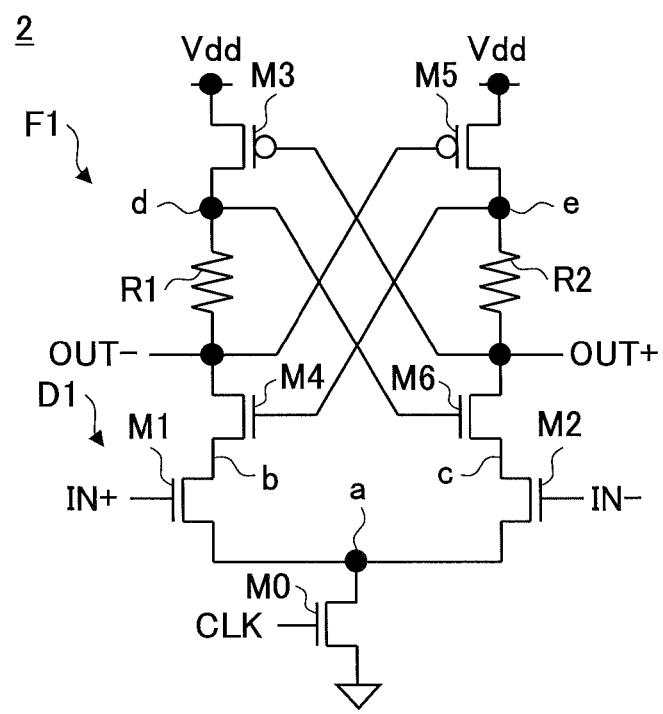
FIG. 4 is a configuration diagram of a dynamic comparator 2 which is a first embodiment of the present invention.

FIG. 4 is a configuration diagram of a dynamic comparator 2 which is a first embodiment of the present invention. The dynamic comparator 2 has a transistor M0 functioning as a switch which turns on/off in synchronization with a clock signal CLK, a differential pair D1 which conducts an operation of comparison in synchronization with turning on/off of the transistor M0, and a positive feedback part F1 which outputs a result of comparison by the differential pair D1, and is integrated on a semiconductor integrated circuit by including a CMOS process.

The transistor M0 turns on when a clock signal CLK supplied to a gate thereof is at a high level and turns off when the clock signal CLK supplied to the gate is at a low level. It is possible for the differential pair D1 to conduct an operation of comparison in the case where the transistor M0 is at an on-state and it is impossible for the differential pair D1 to conduct an operation of comparison in the case where the transistor M0 is at an off-state. For the transistor M0, a source thereof is connected to ground and a drain thereof is connected to a source of the differential pair D1.

The differential pair D1 is composed of a pair of transistors M1 and M2 whose sources are commonly connected to a node a. An input voltage IN+ is supplied to a gate of the transistor M1 and an input voltage IN− is supplied to a gate of the transistor M2. The differential pair D1 conducts comparison for a magnitude relation between the input voltages IN+ and IN−.

The positive feedback part F1 is provided with transistors M3 and M4 which compose a first CMOS inverter, a first resistor R1 inserted between the transistors M3 and M4, transistors M5 and M6 which compose a second CMOS inverter, and a second resistor R2 inserted between the transistors M5 and M6. The positive feedback part F1 is arranged between an electric power supply voltage Vdd and a drain of the differential pair D1. Sources of the transistors M3 and M5 are connected to the electric power supply voltage Vdd while a source of the transistor M4 is connected to a drain of the transistor M1 at a node b and a source of the transistor M6 is connected to a drain of the transistor M2 at a node c.

Furthermore, a gate of the transistor M5 is connected to a drain of the transistor M4 connected to a lower electric potential side of the resistor R1. A gate of the transistor M6 is connected to a drain of the transistor M3 connected to a node d at a higher electric potential side of the resistor R1. A gate of the transistor M2 is connected to a drain of the transistor M6 connected to a lower electric potential side of the resistor R2. A gate of the transistor M4 is connected to a drain of the transistor M5 connected to a node e at a higher electric potential side of the resistor R2.

An output voltage OUT− is taken from a connection point between the resistor R1 and a drain of the transistor M4 and an output voltage OUT+ is taken from a connection point between the resistor R2 and a drain of the transistor M6.

Figure 1:
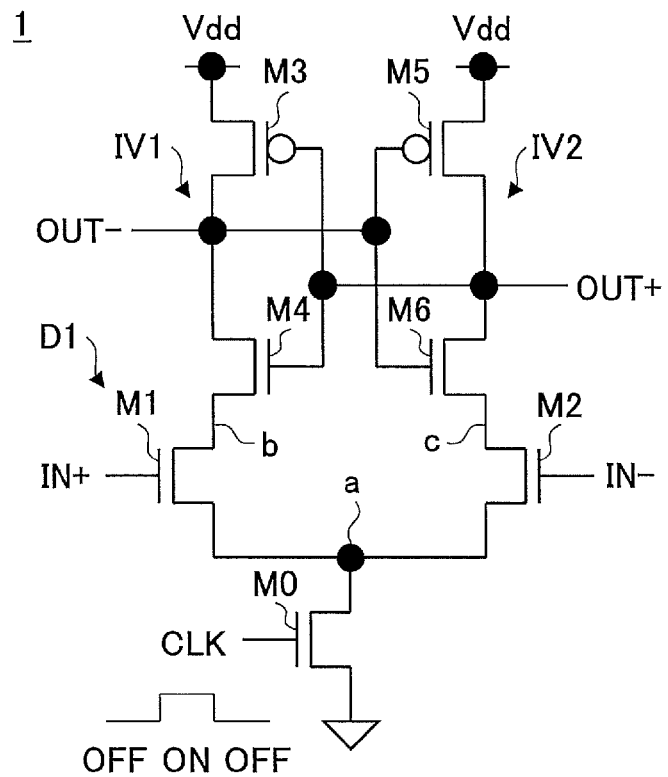
FIG. 1 is a configuration diagram of a conventional dynamic comparator 1.
Figure 2:
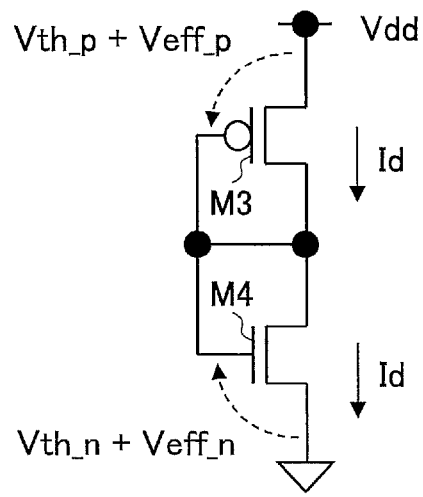
FIG. 2 illustrates a condition on which an input and an output of a CMOS inverter are balanced.
Figure 3:
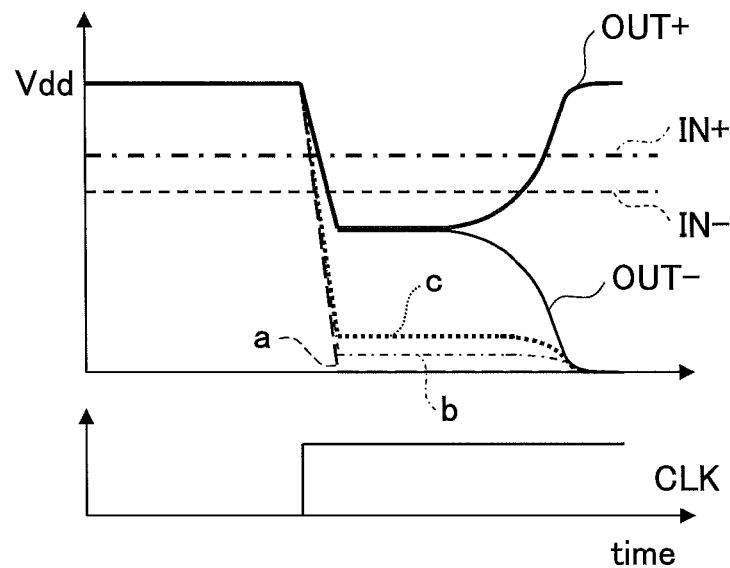
FIG. 3 is a diagram illustrating a time period for determination in a case of a conventional technique.
Figure 5:
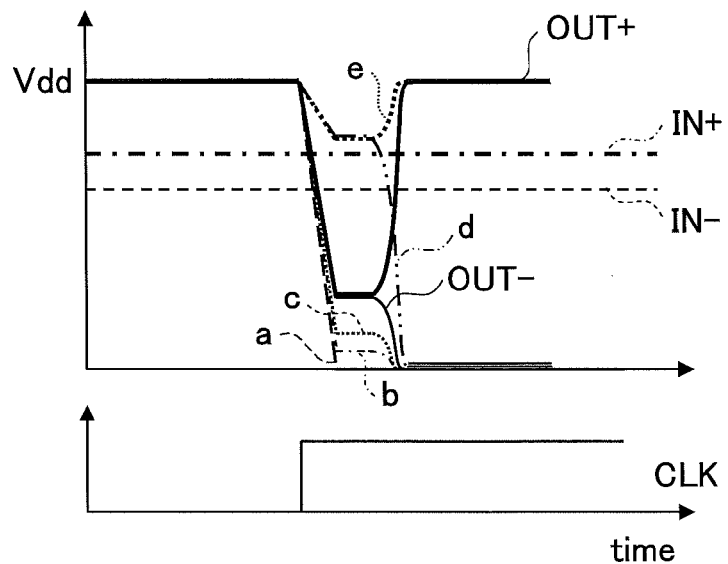
FIG. 5 is a diagram illustrating a time period for determination in a case where the present invention is applied.

Since the positive feedback part F1 has such a configuration, it is possible to apply a sufficient voltage to each gate of the CMOS inverters even when the electric power supply voltage Vdd is on a low voltage condition, so that it is possible to shorten a stabilization time period of an output on a low voltage operation compared to that of FIG. 3, as illustrated in FIG. 5, and it is possible to conduct determination of a magnitude relation between the input voltages IN+ and IN− within a desired time period.

That is, it is possible to raise a gate electric potential of the transistor M6 and lower a gate electric potential of the transistor M5 due to a voltage between both ends of the resistor R1 to be generated by an electric current passing through the resistor R1. Similarly, it is possible to raise a gate electric potential of the transistor M4 and lower a gate electric potential of the transistor M3 due to a voltage between both ends of the resistor R2 to be generated by an electric current passing through the resistor R2. As a result, it is possible to raise a gate driving voltage to be applied between the gate and source of each of the transistors M3, M4, M5, and M6, so that it is possible to make a positive feedback function correctly even when the electric power supply voltage Vdd is on a low voltage condition.

Figure 6:
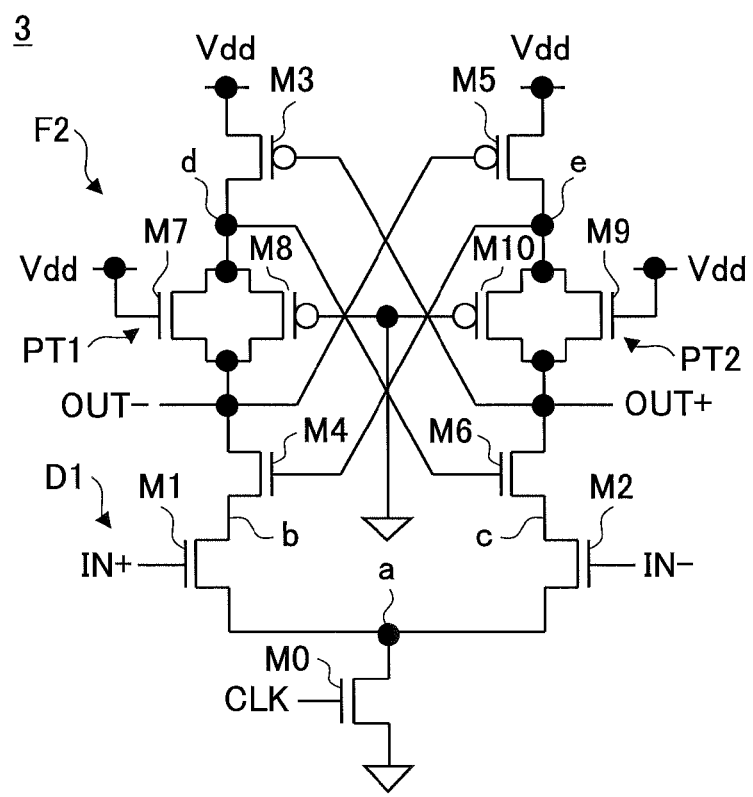
FIG. 6 is a configuration diagram of a dynamic comparator 3 which is a second embodiment of the present invention.

FIG. 6 is a configuration diagram of a dynamic comparator 3 which is a second embodiment of the present invention. For configurations similar to those of FIG. 4, descriptions thereof will be omitted. Although a resistor to be inserted between a PMOS transistor and an NMOS transistor of a CMOS inverter may be an ordinary resistor as illustrated in FIG. 4, a positive feedback part F2 of the dynamic comparator 3 in FIG. 6 is configured in such a manner that a configuration provided by combining a PMOS transistor whose gate is connected to a lower electric potential (for example, ground) and an NMOS transistor whose gate is connected to a higher electric potential (for example, an electric power supply voltage Vdd) in parallel is used as a resistor. Such a parallel combined configuration will be referred to as a "parallel transistor" below. A parallel transistor PT1 is composed of transistors M7 and M8 and a parallel transistor PT2 is composed of transistors M9 and M10.

In such a case, the parallel transistors PT1 and PT2 function as variable resistors in such a manner that values of resistance thereof increase on a condition of low electric power supply voltage and values of resistance thereof decrease on a condition of high electric power supply voltage. That is because it is not possible to ensure voltages between gates and sources of the parallel transistors PT1 and PT2 sufficiently as an electric power supply voltage Vdd decreases to some extent, whereby on-resistances of the parallel transistors PT1 and PT2 increase and it is difficult for electric currents to pass through the parallel transistors PT1 and PT2. Since the parallel transistors PT1 and PT2 function as variable resistors, it is possible to generate a sufficient electric potential difference between both ends of the resistor (namely, between drains and sources of the parallel transistors PT1 and PT2) even on a condition of low electric power supply voltage on which an electric current hardly passes through the CMOS inverter, and hence, a normal operation of the dynamic comparator 3 is possible on a condition that an electric power supply voltage Vdd is a lower voltage than that of the case of FIG. 4.

Additionally, a configuration may be provided such that the parallel transistor PT1 is replaced with the transistor M7 whose gate is connected to a higher electric potential and the parallel transistor PT2 is replaced with the transistor M9 whose gate is connected to a higher electric potential (or the transistors M8 and M10 are removed) in the configuration illustrated in FIG. 6. Furthermore, a configuration may be provided such that the parallel transistor PT1 is replaced with the transistor M8 whose gate is connected to a lower electric potential and the parallel transistor PT2 is replaced with the transistor M10 whose gate is connected to a lower electric potential (or the transistors M7 and M9 are removed) in the configuration illustrated in FIG. 6. However, variations in on-resistances of the parallel transistors PT1 and PT2 against a change in the electric power supply voltage Vdd is less than that of a configuration of only one transistor, and hence, the configuration illustrated in FIG. 6 is advantageous in that an operation of the dynamic comparator is stable on a condition that the electric power supply voltage Vdd is a low voltage.

Figure 7:
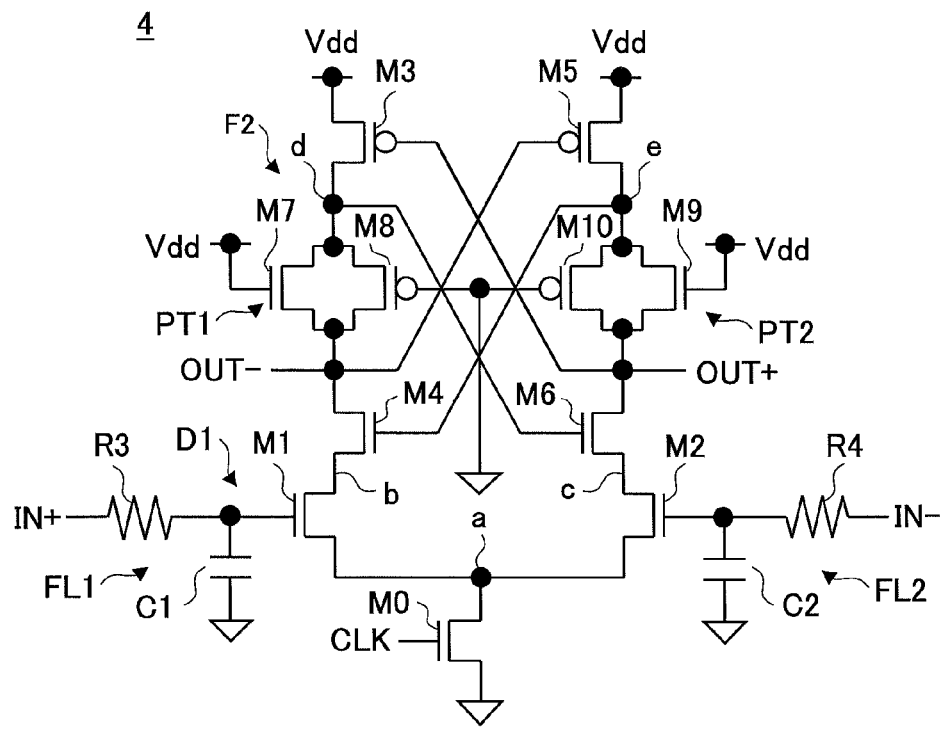
FIG. 7 is a configuration diagram of a dynamic comparator 4 which is a third embodiment of the present invention.

FIG. 7 is a configuration diagram of a dynamic comparator 4 which is a third embodiment of the present invention. For configurations similar to those of the embodiments described above, descriptions thereof will be omitted. The dynamic comparator 4 has a configuration such that a CR filter FL1 is connected to a transistor M1 and a CR filter FL2 is connected to a gate of a transistor M2. As such a configuration of CR filters is provided, it is possible to suppress noise superposing on input voltages IN+ and IN− due to gate capacitances of a differential pair D1 when the dynamic comparator 4 conducts determination of a magnitude relation in synchronization with an inputted clock signal CLK (specifically, when a voltage level at a node a is inverted).

The CR filter FL1 is composed of a resistor R3 which is connected to a gate of the transistor M1 in series and a capacitor C1 which is arranged between the gate of the transistor M1 and ground. The CR filter FL2 is composed of a resistor R4 which is connected to a gate of the transistor M2 in series and a capacitor C2 which is arranged between the gate of the transistor M2 and ground.

Figure 8:
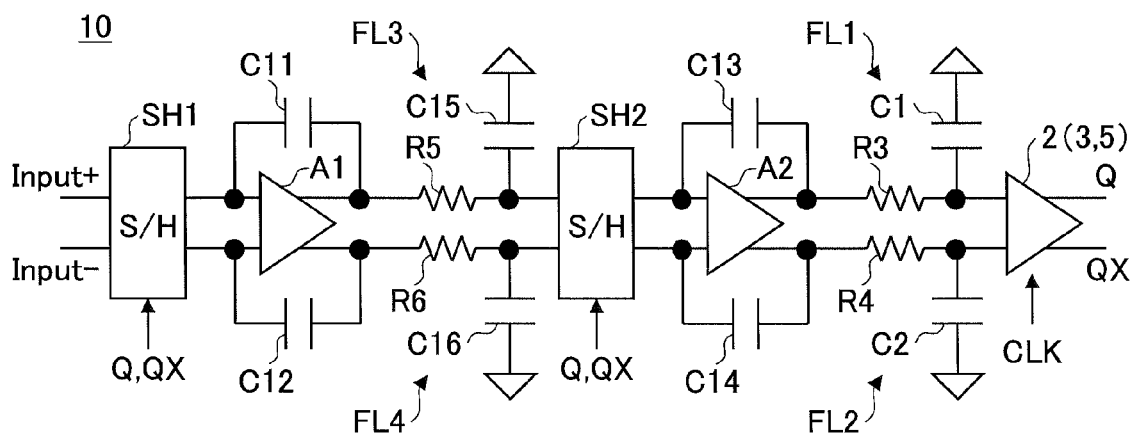
FIG. 8 is a configuration diagram of a ΔΣ type AD converter which is an embodiment of the present invention.

In a case of a configuration provided in such a manner that an output voltage of an integrator is inputted to a differential pair of a dynamic comparator, for example, a ΔΣ type AD converter 10 illustrated in FIG. 8, it is possible to suppress noise provided on an output of the integrator by providing a noise filter (specifically, CR filters FL1 and FL2) between the integrator and the dynamic comparator, and hence, it is possible to suppress degrading of an AD conversion precision. Furthermore, it is possible to reduce a time for an operation of an operational amplifier A2 used in the integrator to be restored to a normal operation even when noise is provided on an output of the integrator.

Furthermore, in a two or more stage ΔΣ type AD converter, a noise filter is inserted at a location at which an output varies at time of sampling, such as a connection part between integrators, whereby it is possible to suppress degradation of AD conversion precision. In the case of FIG. 8, CR filters FL3 and FL4 are inserted between an operational amplifier A1 of an integrator at a first stage and a sample and hold circuit SH2 of an integrator at a second stage.

The CR filter FL3 is composed of a resistor R5 arranged in series between a first output part of the operational amplifier A1 and a first input part of the sample and hold circuit SH2 and a capacitor C15 arranged between a first input part of the sample and hold circuit SH2 and ground. The CR filter FL4 is composed of a resistor R6 arranged in series between a second output part of the operational amplifier A1 and a second input part of the sample and hold circuit SH2 and a capacitor C16 arranged between a second input part of the sample and hold circuit SH2 and ground.

The ΔΣ type AD converter 10 converts analog differential input voltages Input+ and Input− to high level or low level digital differential output signals G and QX. The signal Q corresponds to an output voltage OUT+ of the dynamic comparator and a signal QX corresponds to an output signal OUT− of the dynamic comparator.

A sample and hold circuit SH1 conducts sampling and holding of the differential input voltages input+ and Input− depending on the differential output signals Q and QX and supplies voltages subjected to the sampling and holding to the integrator at the first stage. The integrator at the first stage is provided with a differential input-differential output type operational amplifier A1 and capacitors C11 and C12 connected to differential input and output parts of the operational amplifier A1. An output of the integrator at the first stage is inputted to the sample and hold circuit SH2 through the CR filters FL3 and FL4. The sample and hold circuit SH2 conducts sampling and holding of an output of the integrator at the first stage as inputted though the CR filters FL3 and FL4, depending on the differential output signals Q and QX, and supplies voltages subjected to the sampling and holding to the integrator at the second stage. The integrator at the second stage is provided with a differential input-differential output type operational amplifier A2 and capacitors C13 and C14 connected to differential input and output parts of the operational amplifier A2. An output of the integrator at the second stage is inputted to the dynamic comparator through the CR filters FL1 and FL2.

Figure 9:
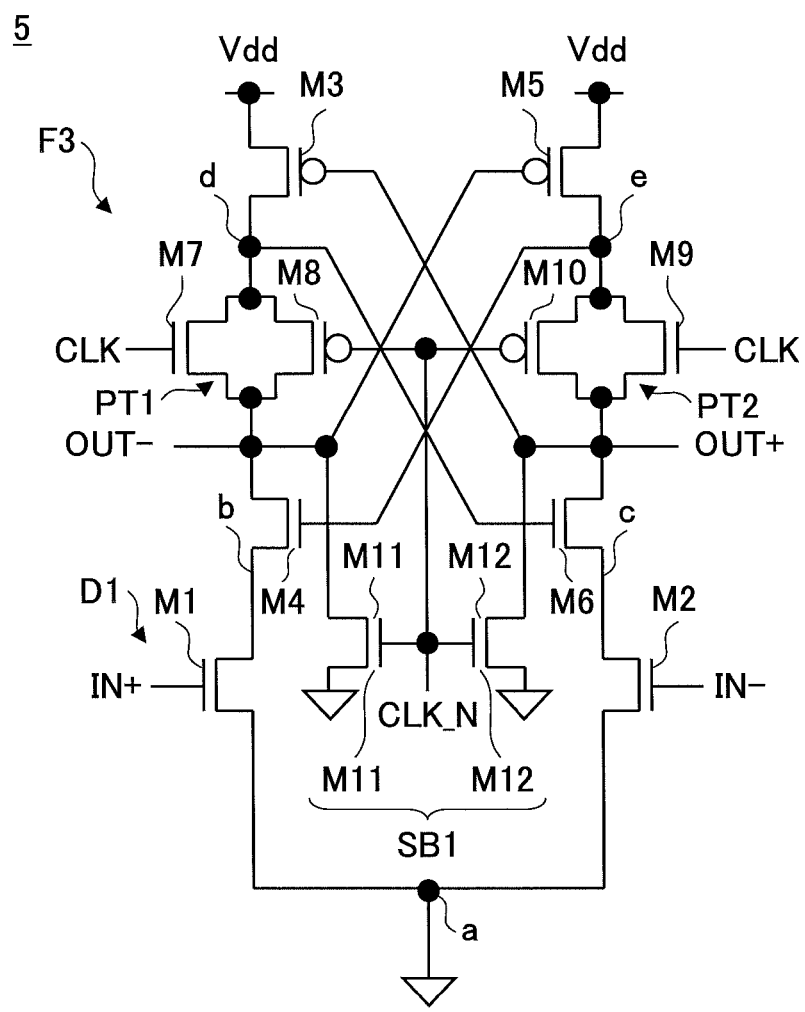
FIG. 9 is a configuration diagram of a dynamic comparator 5 which is a fourth embodiment of the present invention.

FIG. 9 is a configuration diagram of a dynamic comparator 5 which is a fourth embodiment of the present invention. For configurations similar to those of the embodiments described above, descriptions thereof will be omitted.

For the dynamic comparator 5, the transistor M0 in the configuration of FIG. 6 is removed and a reference electrode of a differential pair D1 which receives a differential input (source electrodes of transistors M1 and M2 in the case of FIG. 9) is fixed at a constant low electric potential (for example, ground). Then, clock signals CLK and CLK_N whose levels are inverted mutually are inputted to parallel transistors PT1 and PT2 for enabling a low voltage operation of the dynamic comparator 5, thereby providing a function of switching the feasibility of an operation of comparison of the differential pair D1 in addition to a function of a variable resistor similar to the case of FIG. 6.

In the case of the configuration of FIG. 6, when the node a is connected to ground by the switch M0 as described above, an electric current transiently passes through a capacitance between the gate and source of the differential pair D1 and there is a risk of superposing noise on the input voltages IN+ and IN−. However, as source electrodes of the differential pair D1 are fixed at a constant electric potential like the configuration of FIG. 9, a variation in a voltage between a gate and a source of the differential pair D1 is suppressed, and hence, it is possible to suppress noise to be superposed on input voltages IN+ and IN−. Furthermore, the stability of a circuit at an anterior stage for supplying the input voltages IN+ and IN− is improved because it is possible to suppress superposing noise.

In the case of a positive feedback part F3 of the dynamic comparator 5 in FIG. 9, a common clock signal CLK is inputted to each of gates of NMOS transistors M7 and M9 and a common clock signal CLK_N is inputted to each of gates of PMOS transistors M8 and M10. As the clock signal CLK is inputted to the transistor M7 and the clock signal CLK_N is inputted to the transistor M8, the transistors M7 and M8 turn on at the same timing. Similar matters also apply to the transistors M9 and M10. The transistors M7 and M9 turn on in the case where the clock signal CLK is at a high level and turn off in the case of a low level. The transistors M8 and M10 turn off in the case where the clock signal CLK_N is at a high level and turn on in the case of a low level.

When the clock signal CLK is at a low level and the clock signal CLK_N is at a high level, both the parallel transistors PT1 and PT2 turn off, and hence, it is not possible for the differential pair D1 to conduct an operation of comparison. On the contrary, when the clock signal CLK is at a high level and the clock signal CLK_N is at a low level, both the parallel transistors PT1 and PT2 turn on, and hence, it is possible for the differential pair D1 to conduct an operation of comparison. High levels of the clock signals CLK and CLK_N may be set at a level of an electric power supply voltage Vdd and low levels of the clock signals CLK and CLK_N may be set at a level of ground.

As a high level of the clock signal CLK is set at a level of the electric power supply voltage Vdd, on-resistances of the parallel transistors PT1 and PT2 increase with decreasing the electric power supply voltage Vdd. Hence, when the levels of the clock signals CLK and CLK_N are levels allowing an operation of comparison of the differential pair D1, it is possible to raise gate electric potentials of transistors M4 and M6 and lower gate electric potentials of transistors M3 and M5 due to an increase of the on-resistances of parallel transistors PT1 and PT2. As a result, it is possible to raise gate driving voltages to be applied to a gate and a source of each of transistors M3, M4, M5, and M6, and hence, it is possible to make a positive feedback to function even when the electric power supply voltage Vdd is on a low voltage condition.

Furthermore, a standby circuit for turning on/off the transistors M3 and M5 depending on the clock signal CLK_N may be provided. FIG. 9 illustrates a standby circuit SB1. The standby circuit SB1 is composed of NMOS transistors M11 and M12 for which the clock signal CLK_N is inputted to gates thereof. As such a standby circuit is provided, it is possible to initialize an electric charge on a node of each transistor (for example, an electric charge on a parasitic capacitance between a source (or drain) of the transistor and a substrate) every clock period of the clock signal CLK_N. That is, even if an electric charge on a node of each transistor is changed, it is possible to restore such an electric charge to a certain value every clock period of the clock signal CLK_N, and hence, it is possible to improve a precision of comparison of the dynamic comparator.

In the case of the standby circuit SB1 in FIG. 9, sources of the transistors M11 and M12 are connected to ground. A drain of the transistor M11 is connected to a gate of the transistor M5 (that is, an output point of a result of comparison between the parallel transistor PT1 and a drain of the transistor M4). A drain of the transistor M12 is connected to a gate of the transistor M3 (that is, an output point of a result of comparison between the parallel transistor PT2 and a drain of the transistor M6).

When a level of the clock signal CLK_N is a low level at which an operation of comparison of the differential pair D1 is conducted, the transistors M11 and M12 turn off. Accordingly, the standby circuit SB1 does not contribute to an operation of comparison of the differential pair D1 when the clock signal CLK_N is at a low level.

On the other hand, when a level of the clock signal CLK_N is a high level at which no operation of comparison of the differential pair D1 is conducted, the transistors M11 and M12 turn on. As the transistors M11 and M12 turn on, both connection nodes among the parallel transistor PT1, transistor M4, and transistor M5 and connection nodes among the parallel transistor PT2, the transistor M6, and the transistor M3 are at low levels (ground levels). Furthermore, as the transistors M11 and M12 turn on, the transistors M3 and M5 turn on, and hence, both a connection node d among the parallel transistor PT1, the transistor M3, and the transistor M6 and a connection node e among the parallel transistor PT2, the transistor M5, and the transistor M4 are at high levels (a level of the electric power supply voltage Vdd). Thus, it is possible to initialize each connection node at a certain level every time when the clock signal CLK_N switches from a low level to a high level.

Although preferred practical examples of the present invention have been described in detail above, the present invention is not limited to the practical examples described above and it is possible to apply various modifications and substitutions to the practical examples described above without departing from the scope of the present invention.

For example, although the dynamic comparator having a differential pair composed of a pair of NMOS transistors has been illustrated as an embodiment of the present invention, it is also possible to apply the present invention to a dynamic comparator having a differential pair composed of a pair of PMOS transistors.

Furthermore, it is also possible to apply the present invention to a configuration in which a switch element (typically, a transistor) capable of causing a short circuit between a drain and a source of each of crossed transistors (for example, M3, M4, M5, and M6 in the case of FIG. 4) is connected to each transistor in parallel.

Furthermore, although the ΔΣ type AD converter has been illustrated as an embodiment of the present invention, it is also possible to apply the present invention to another type of an AD converter such as a pipeline type, a successive approximation type, or a flash type.

APPENDIX

Embodiment (1) is a comparator having a switch which turns on/off in synchronization with a clock signal, a differential pair which conducts an operation of comparison in synchronization with turning on/off of the switch, and a positive feedback part which outputs a result of comparison by the differential pair, wherein the comparator is characterized in that the positive feedback part is provided with a first resistor inserted between a first PMOS transistor and a first NMOS transistor and a second resistor inserted between a second PMOS transistor and a second NMOS transistor, wherein a gate of the second PMOS transistor is connected to a lower electric potential side of the first resistor, wherein a gate of the second NMOS transistor is connected to a higher electric potential side of the first resistor, wherein a gate of the first PMOS transistor is connected to a lower electric potential side of the second resistor, and wherein a gate of the first NMOS transistor is connected to a higher electric potential side of the second resistor.

Embodiment (2) is the comparator as described in Embodiment (1), wherein values of resistance of the first resistor and second resistor increase with decreasing an electric power supply voltage of the positive feedback part.

Embodiment (3) is the comparator as described in Embodiment (2), wherein the first resistor and the second resistor are PMOS transistors whose gates are connected to a lower electric potential, NMOS transistors whose gates are connected to a higher electric potential, or a parallel configuration of the transistors.

Embodiment (4) is the comparator as described in Embodiment (2), wherein the switch is the first resistor and the second resistor, wherein the first resistor and the second resistor have parallel configurations of an NMOS transistor for which a first clock signal is inputted to a gate thereof and a PMOS transistor for which a second clock signal whose level is inverted with respect to that of the first clock signal is inputted to a gate thereof, and wherein a reference electrode of the differential pair is fixed at a constant electric potential.

Embodiment (5) is the comparator as described in Embodiment (4), having a circuit which turns on/off the first PMOS transistor and the second PMOS transistor depending on the second clock signal.

Embodiment (6) is the comparator as described in Embodiment (1), wherein the first PMOS transistor and the first NMOS transistor are elements for composing the first CMOS inverter and the second PMOS transistor and the second NMOS transistor are elements for composing the second CMOS inverter.

Embodiment (7) is an AD converter provided with the comparator as described in Embodiment (1).

The present application claims priority based on Japanese Patent Application No. 2010-207226 filed on Sep. 15, 2010, the entire contents of which are hereby incorporated by reference.

EXPLANATION OF LETTERS OR NUMERALS 1, 2, 3, 4, 5 dynamic comparator
10 ΔΣ type AD converter
A* operational amplifier
C* capacitor
D1 differential pair
F* positive feedback part
FL* CR filter
IV1, IV2 CMOS inverter
M* MOSFET
PT1, PT2 parallel transistor
R* resistor
SB1 standby circuit
SH* sample and hold circuit
* is a numeral.

The invention claimed is:

1. A comparator comprising:
a switching element configured to turn on or off in synchronization with a clock signal;
a differential pair configured to conduct a comparison between input voltages in synchronization with turning on or off of the switching element; and
a positive feedback part configured to output a result of the comparison conducted by the differential pair, the positive feedback part including a first CMOS inverter and a second CMOS inverter, the first CMOS inverter and the second CMOS inverter being subjected to a positive feedback, the first CMOS inverter including a first PMOS transistor, a first NMOS transistor, and a first element configured to provide an electric potential difference between a drain of the first PMOS transistor and a drain of the first NMOS transistor, the second CMOS inverter including a second PMOS transistor, a second NMOS transistor, and a second element configured to provide an electric potential difference between a drain of the second PMOS transistor and a drain of the second NMOS transistor, a higher electric potential side of the first element being connected to a gate of the second NMOS transistor, a lower electric potential side of the first element being connected to a gate of the second PMOS transistor, a higher electric potential side of the second element being connected to a gate of the first NMOS transistor, and a lower electric potential side of the second element being connected to a gate of the first PMOS transistor,
wherein the differential pair is connected to both a source of the first NMOS transistor and a source of the second NMOS transistor.

2. The comparator as claimed in claim 1, wherein the first element is a first resistor between the drain of the first PMOS transistor and the drain of the first NMOS transistor and the second element is a second resistor between the drain of the second PMOS transistor and the drain of the second NMOS transistor.

3. The comparator as claimed in claim 1, wherein the first element is a first variable resistance element configured to have a resistance increasing with decreasing an electric power supply voltage to be applied to the positive feedback part and the second element is a second variable resistance element configured to have a resistance increasing with decreasing the electric power supply voltage.

4. The comparator as claimed in claim 3, wherein each of the first variable resistance element and the second variable resistance element is selected from the group consisting of a PMOS transistor, an NMOS transistor, and a combination of a PMOS transistor and an NMOS transistor in parallel.

5. The comparator as claimed in claim 1, wherein:
the switching element includes a third NMOS transistor with a gate to receive the clock signal, the third NMOS transistor being provided between the drain of the first PMOS transistor and the drain of the first NMOS transistor, a fourth NMOS transistor with a gate to receive the clock signal, the fourth NMOS transistor being provided between the drain of the second PMOS transistor and the drain of the second NMOS transistor;
the first element includes a third PMOS transistor with a gate to receive a signal with a level inverted with respect to a level of the clock signal, the third PMOS transistor being provided between the drain of the first PMOS transistor and the drain of the first NMOS transistor; and
the second element includes a fourth PMOS transistor with a gate to receive the signal with a level inverted with respect to a level of the clock signal, the fourth PMOS transistor being provided between the drain of the second PMOS transistor and the drain of the second NMOS transistor.

6. The comparator as claimed in claim 5, further comprising a circuit configured to turn on or off the first PMOS transistor and the second PMOS transistor in synchronization with the signal with a level inverted with respect to a level of the clock signal.

7. An analog-to-digital converter comprising:
the comparator as claimed in claim 1;
an input part configured to input an analog input voltage to the differential pair of the comparator; and
an output part configured to output a digital output voltage from the positive feedback part of the comparator.

* * * * *